US012700371B2

(12) United States Patent
Huang et al.

(10) Patent No.: US 12,700,371 B2
(45) Date of Patent: Aug. 4, 2026

(54) ELECTRONIC DEVICE

(71) Applicant: Prevalent Display LLC, Dallas, TX (US)

(72) Inventors: Sheng-Feng Huang, Miao-Li County (TW); Chien-Feng Shih, Miao-Li County (TW)

(73) Assignee: Prevalent Display LLC, Dallas, TX (US)

( * ) Notice: Subject to any disclaimer, the term of this patent is extended or adjusted under 35 U.S.C. 154(b) by 74 days.

(21) Appl. No.: 19/018,230

(22) Filed: Jan. 13, 2025

(65) Prior Publication Data

US 2025/0148999 A1 May 8, 2025

Related U.S. Application Data

(60) Continuation of application No. 18/950,878, filed on Nov. 18, 2024, which is a continuation of application No. 18/232,463, filed on Aug. 10, 2023, now Pat. No. 12,183,290, which is a continuation of application No. 17/517,067, filed on Nov. 2, 2021, now Pat. No. (Continued)

(30) Foreign Application Priority Data

Jun. 17, 2016 (CN) .......................... 201610436707.6

(51) Int. Cl.
| | |
|---|---|
| *G11C 19/00* | (2006.01) |
| *G09G 3/20* | (2006.01) |
| *G09G 3/3225* | (2016.01) |
| *G09G 3/3233* | (2016.01) |
| *G09G 3/3266* | (2016.01) |
| *G11C 19/28* | (2006.01) |

(Continued)

(52) U.S. Cl.
CPC ............ *G09G 3/3266* (2013.01); *G09G 3/20* (2013.01); *G09G 3/3225* (2013.01); *G09G 3/3233* (2013.01); *G11C 19/28* (2013.01); *G11C 19/287* (2013.01); *H10K 59/1213* (2023.02); *G09G 3/3677* (2013.01); *G09G 2300/043* (2013.01); *G09G 2310/0286* (2013.01); *G09G 2310/0289* (2013.01); *G09G 2310/08* (2013.01); *G09G 2320/045* (2013.01)

(58) Field of Classification Search
CPC .................. G11C 19/28; G11C 19/287; G09G 2310/0286; G09G 3/3677; G09G 3/20; G09G 3/3225; G09G 3/3222; G09G 3/3266
See application file for complete search history.

(56) References Cited

U.S. PATENT DOCUMENTS

| | | | |
|---|---|---|---|
| 9,287,329 B1 * | 3/2016 | Lee ...................... H10D 86/471 |
| 2015/0055047 A1 * | 2/2015 | Chang .................. G09G 3/3225 349/43 |
| 2023/0386413 A1 | 11/2023 | Huang et al. |

* cited by examiner

*Primary Examiner* — Tuan T Lam

(74) *Attorney, Agent, or Firm* — Farjami & Farjami LLP

(57) ABSTRACT

An electronic device includes a substrate, a first transistor, a second transistor, an electronic unit and a conductor. The first transistor is disposed on the substrate and comprises a first semiconductor layer. The second transistor is disposed on the substrate and comprises a second semiconductor layer, wherein a material of the first semiconductor layer is different from a material of the second semiconductor layer. The electronic unit is disposed on the substrate and electrically connected to the second transistor. The conductor is electrically connected to the first semiconductor layer and the second semiconductor layer.

20 Claims, 8 Drawing Sheets

Related U.S. Application Data

11,763,751, which is a continuation of application No. 16/542,843, filed on Aug. 16, 2019, now Pat. No. 11,183,123, which is a division of application No. 15/610,682, filed on Jun. 1, 2017, now Pat. No. 10,438,539.

(51) Int. Cl.
*H10K 59/121*     (2023.01)
*G09G 3/36*       (2006.01)

ELECTRONIC DEVICE

CROSS-REFERENCE TO RELATED APPLICATIONS

This application claims the benefits of the Chinese Patent Application Ser. No. 201610436707.6, filed on Jun. 17, 2016. This application is a Division of U.S. patent application for "GATE DRIVING CIRCUIT AND DISPLAY PANEL INCLUDING THE SAME", U.S. application Ser. No. 15/610,682 filed Jun. 1, 2017. This application is a continuation (CA) of U.S. patent application for "GATE DRIVING CIRCUIT AND DISPLAY PANEL INCLUDING THE SAME", U.S. application Ser. No. 16/542,843 filed Aug. 16, 2019. This application is a continuation (CA) of U.S. patent application for "GATE DRIVING CIRCUIT AND DISPLAY PANEL INCLUDING THE SAME", U.S. application Ser. No. 17/517,067 filed Nov. 2, 2021. This application is a continuation (CA) of U.S. patent application for "ELECTRONIC DEVICE", U.S. application Ser. No. 18/232,463 filed Aug. 10, 2023, and the subject matter of which is incorporated herein by reference. This application is a continuation (CA) of U.S. patent application for "ELECTRONIC DEVICE", U.S. application Ser. No. 18/950,878 filed Nov. 18, 2024, and the subject matter of which is incorporated herein by reference.

BACKGROUND

1. Field of the Disclosure

The present disclosure relates to the technical field of display devices and, more particularly, to a gate driving circuit with multi-level voltage.

2. Description of Related Art

In general, a display device includes a plurality of pixel units, a source driver and a gate driving circuit. The source driver provides a plurality of data signals to the pixel units. The gate driving circuit includes multiple stages of shift registers to generate a plurality of gate signals, so as to turn on or turn off the pixel units, thereby controlling the writing of data signals.

SUMMARY

The present disclosure provides a gate driving circuit with multi-level output voltage. In one embodiment of the driving circuit of the present disclosure, there is provided a stack-up structure of an N-type Indium Gallium Zinc Oxide (IGZO) transistor and a P-type low temperature polysilicon (LTPS) transistor connected with a gate.

The present disclosure provides a gate driving circuit, which comprises at least one shift unit and at least one switch unit. The at least one shift unit receives a start input signal, a first clock input signal and a second clock input signal to generate an enable output signal. The at least one switch unit is connected to the shift unit and outputting a third clock signal with multi-level voltage based on the enable output signal.

The present disclosure provides a gate driving circuit, which comprises a first shift unit, a second shift unit, an inverting unit and a switch unit. The first shift unit has a start input, a first clock input and a second clock input to receive a start input signal, a first clock input signal and a second clock input signal, respectively, to generate a first enable output signal. The second shift unit has a start input, a first clock input and a second clock input to receive the first enable output signal, the second clock input signal and the first clock input signal, respectively, to generate a second enable output signal. The inverting unit is connected to the first shift unit and receiving the first enable output signal to generate an inverted first enable output signal. The switch unit is connected to the inverting unit and the second shift unit and receiving a fourth clock signal with a two-level voltage or a fifth clock signal, based on the inverted first enable output signal and the second enable output signal, to output a sixth clock signal composed of the fourth clock signal and the fifth clock signal from an output end thereof.

DETAILED DESCRIPTION OF THE PREFERRED EMBODIMENT

Figure 1:
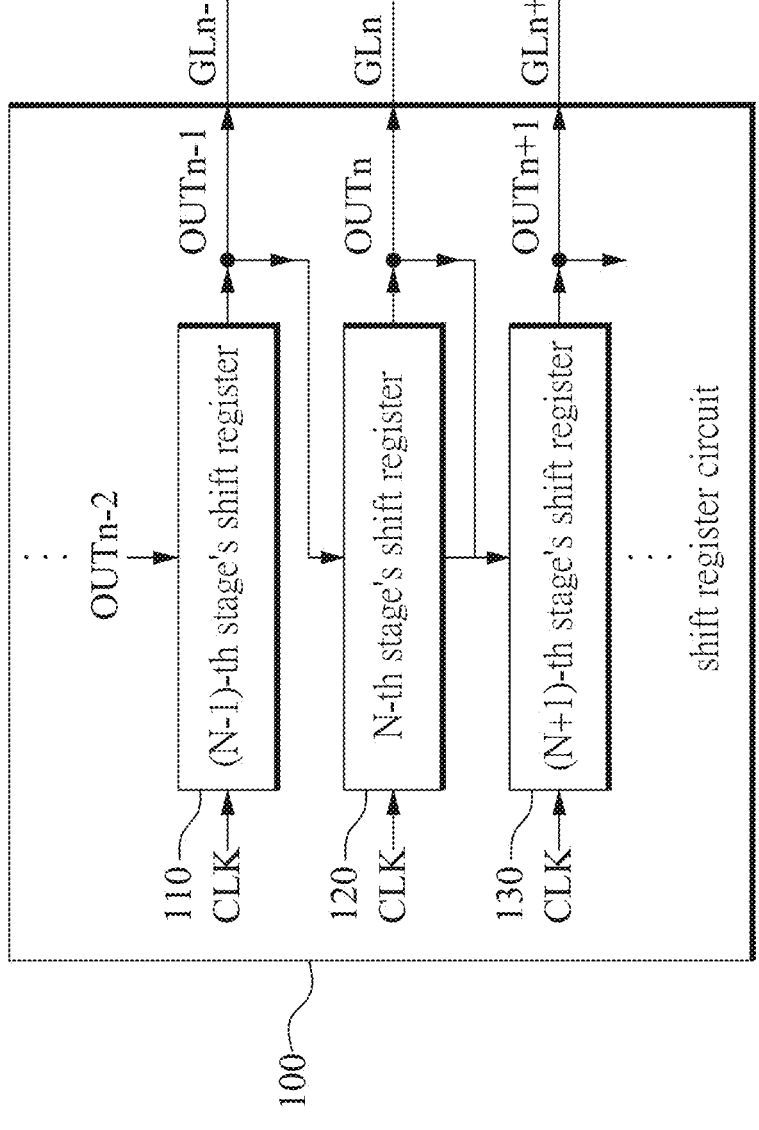
FIG. 1 is the schematic diagram of a gate driving circuit according to the present disclosure.

FIG. 1 is the schematic diagram of a gate driving circuit according to the present disclosure. As shown in FIG. 1, the gate driving circuit 100 includes multiple stages of shift registers, wherein only the (N−1)-th stage of shift register 110, the N-th stage of shift register 120 and the (N+1)-th stage of shift register 130 are shown for illustrative purpose. Each stage of shift register generates a corresponding gate signal based on the gate signal outputted from the previous stage of shift register and a clock signal CLK, and outputs it to a corresponding gate line. For example, the (N−1)-th stage of shift register 110 generates the gate signal OUTn−1 based on the gate signal OUTn−2 and the clock signal CLK, and outputs it to the gate line GLn−1. The N-th stage of shift register 120 generates the gate signal OUTn, based on the gate signal OUTn−1 and the clock signal CLK, and outputs it to the gate line GLn.

Figure 2:
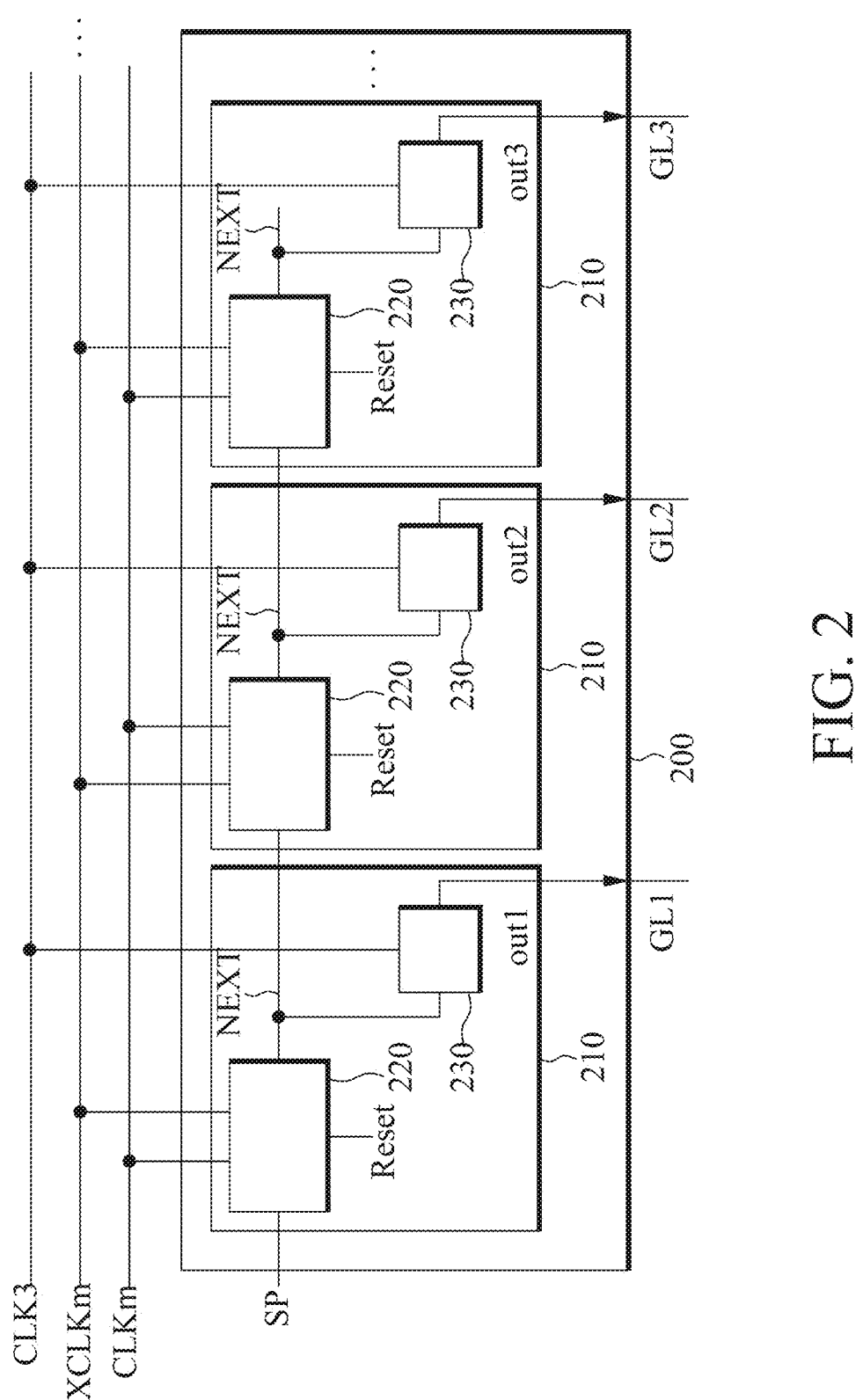
FIG. 2 is the block diagram of a gate driving circuit according to the present disclosure.

FIG. 2 is the block diagram of a gate driving circuit 200 with multi-level output voltage according to the present disclosure. As shown in FIG. 2, the gate driving circuit 200 includes multiple stages of shift register circuits 210. Each stage of shift register circuit 210 has the same circuit structure, wherein the first stage of shift register circuit 210 has a first input end connected to a first clock input signal (CLKm) and a second input end connected to a second clock input signal (XCLKm), and the second stage of shift register circuit 210 has a first input end connected to the second clock input signal (XCLKm) and a second input connected to the first clock input signal (CLKm), and so on.

Each stage of shift register circuit 210 includes a shift unit 220 and a switch unit 230. The first stage of shift register circuit 210 is connected to a first gate line GL1, the second stage of shift register circuit 210 is connected to a second gate line GL2, and the third stage of shift register circuit 210 is connected to a third gate line GL3, and so on.

The gate driving circuit 200 includes at least one shift unit 220 and at least one switch unit 230. The at least one shift unit 220 receives a start input signal (SP), the first clock input signal (CLKm) and the second clock input signal (XCLKm) for generating an enable output signal (NEXT). The at least one switch unit 230 is connected to the shift unit 220 for receiving a third clock signal (CLK3) and outputting the third clock signal (CLK3) with multi-level voltage to the first gate line GL1 based on the enable output signal (NEXT). The enable output signal (NEXT) is a start input signal (SP) of the next stage of shift unit 220.

As shown in FIG. 2, the first stage of shift register circuit 210 receives the start input signal (SP) for generating an enable output signal (NEXT). The enable output signal (NEXT) is a start input signal (SP) of the second stage of shift register circuit 210, and so on. Similar description is applied to the other stages, and thus a detailed description therefor is deemed unnecessary.

Figure 3:
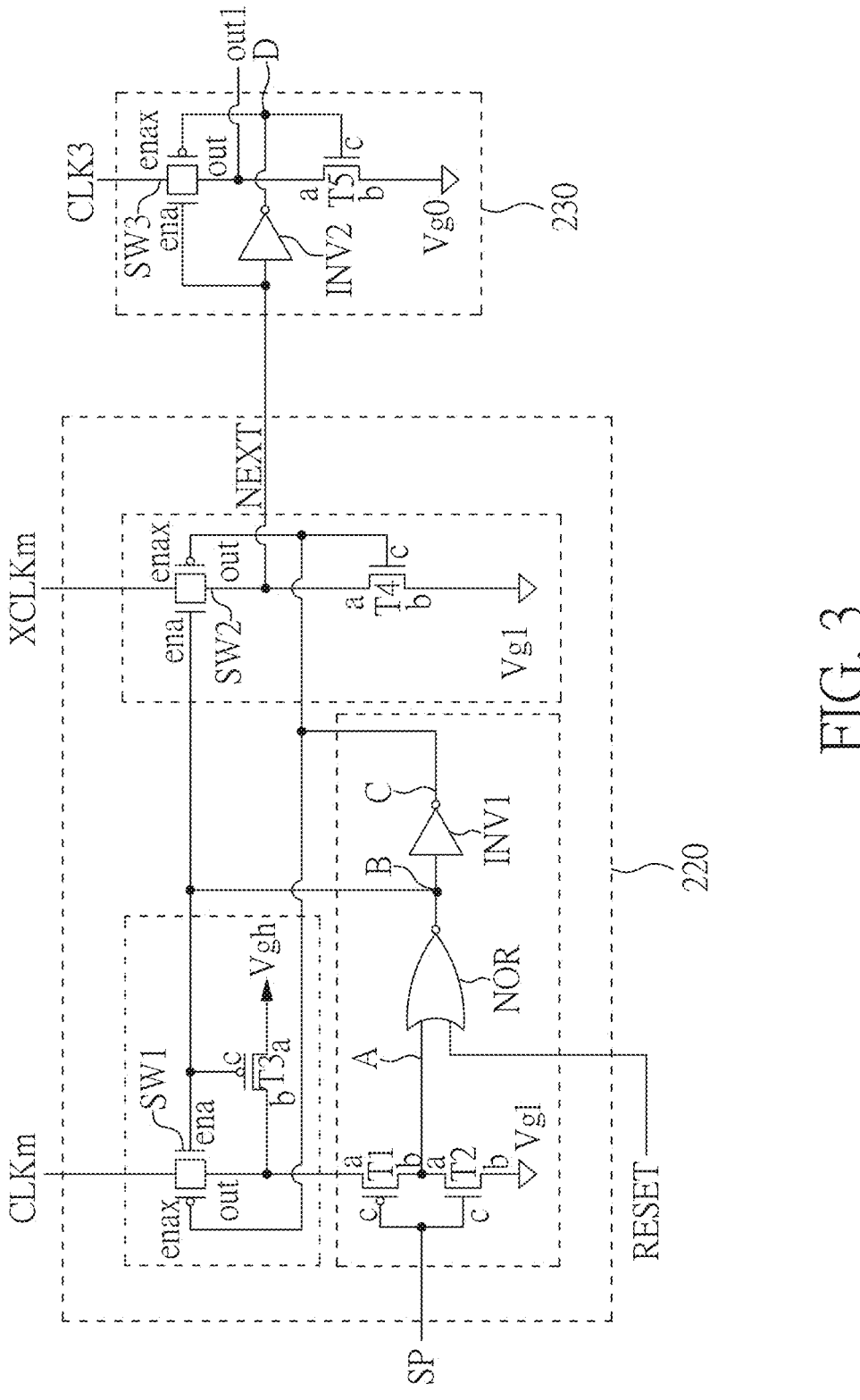
FIG. 3 is the circuit diagram of the shift unit and the switch unit according to the present disclosure.

FIG. 3 is the circuit diagram of the shift unit 220 and the switch unit 230 according to the present disclosure. FIG. 3 shows the shift unit 220 and the switch unit 230 of the first stage of shift register circuit 210. Accordingly, the shift unit 220 receives the start input signal (SP). For the shift unit 220 and the switch unit 230 of the second stage or other stages of shift register circuits 210, the shift unit 220 receives the outputted enable output signal (NEXT) from the previous stage.

As shown in FIG. 3, the shift unit 220 has a first switch (SW1), a second switch (SW2), a first transistor (T1), a second transistor (T2), a third transistor (T3), a fourth transistor (T4), a NOR gate and a first inverter (INV1). The switch unit 230 includes a second inverter (INV2), a third switch (SW3) and a fifth transistor (T5).

The first transistor (T1) has a first end (a) connected to an output end (out) of the first switch (SW1), a second end (b) connected to a first input end of the NOR gate, and a third end (c) connected to the start input signal (SP). The second transistor (T2) has a first end (a) connected to the second end (b) of the first transistor (T1), a second end (b) connected to a low voltage (Vgl), and a third end (c) connected to the start input signal (SP).

The third transistor (T3) has a first end (a) connected to a high voltage (Vgh), a second end (b) connected to the first end (a) of the first transistor (T1), and a third end (c) connected to a first enable input end (ena) of the first switch (SW1) and a first enable input end (ena) of the second switch (SW2).

The fourth transistor (T4) has a first end (a) connected to an output end (out) of the second switch (SW2) and the enable output signal (NEXT), a second end (b) connected to the low voltage (Vgl), and a third end (c) connected to an output end of the first inverter (INV1), a second enable input end (enax) of the first switch (SW1) and a second enable input end (enax) of the second switch (SW2).

The NOR gate has a second input end connected to a reset signal (RESET), and an output end connected to the third end (c) of the third transistor (T3) and an input end of the first inverter (INV1). The first switch (SW1) has a second enable input end (enax) connected to the output end of the first inverter (INV1), and an input end connected to the first clock input signal (CLKm). The second switch (SW2) has an input end connected to the second clock input signal (XCLKm), a first enable input end (ena) connected to the input end of the first inverter (INV1), and a second enable input end (enax) connected to the third end (c) of the fourth transistor (T4).

The fifth transistor (T5) has a first end (a) connected to an output end (out) of the third switch (SW3) and an output end (out1), a second end (b) connected to a middle voltage (Vg0), and a third end (c) connected to an output end of the second inverter (INV2). An input end of the second inverter (INV2) is connected to the enable output signal (NEXT) and a first enable input end (ena) of the third switch (SW3). The third switch (SW3) has a second enable input end (enax) connected to the output end of the second inverter (INV2), and an input end connected to the third clock signal (CLK3) so as to output a third clock signal (CLK3) with three-level voltage through the output end (out). It is noted that the third clock signal can have a multi-level voltage, but not limited to three-level voltage.

Figure 4:
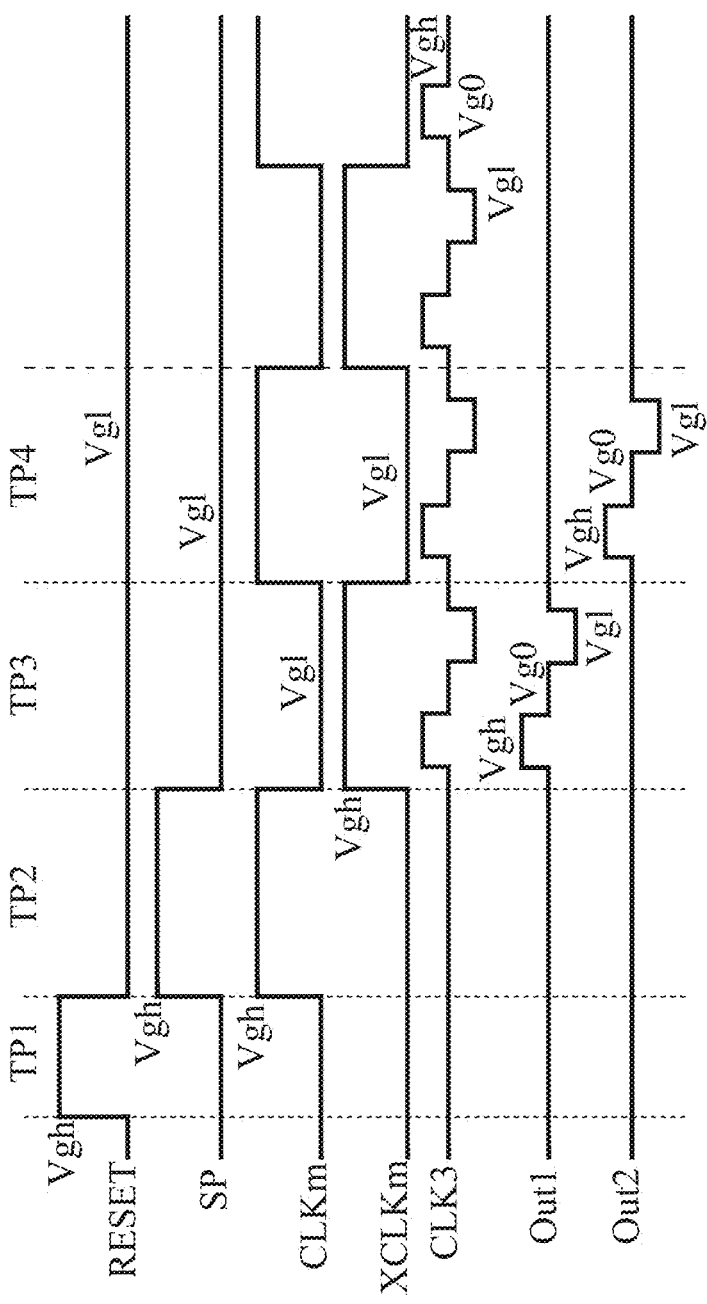
FIG. 4 is the timing diagram the first stage of shift register circuit and the second stage of shift register circuit according to the present disclosure.

FIG. 4 is the timing diagram of the first stage of shift register circuit 210 and the second stage of shift register circuit 210 according to the present disclosure. Please refer to FIG. 2, FIG. 3 and FIG. 4. During the first period (TP1), the reset signal (RESET) is at high voltage (Vgh). Through the function of the NOR gate, the node (B) is at low voltage (Vgl) and the node (C) is at high voltage (Vgh). Thus, the fourth transistor (T4) is turned on, the enable output signal (NEXT) is at low voltage (Vgl), the node (D) is at high voltage (Vgh), and the fifth transistor (T5) is turned on. Thus, the output end (out) of the first stage of third switch (SW3) is at middle voltage (Vg0). Similarly, the output end (out) of the second stage of third switch (SW3) is at middle voltage (Vg0).

During the second period (TP2), the reset signal (RESET) is at low voltage (Vgl), and the start input signal (SP) is at high voltage (Vgh). Besides, the first clock input signal (CLKm) is at high voltage (Vgh), and the second clock input signal (XCLKm) is at low voltage (Vgl). The second transistor (T2) is turned on, the first transistor (T1) is turned off, the node (A) is at low voltage (Vgl), the node (B) is at high voltage (Vgh), and the node (C) is at low voltage (Vgl). Thus, the fourth transistor (T4) is turned off, the first switch (SW1) and the second switch (SW2) are turned on, and the enable output signal (NEXT) is the second clock input signal (XCLKm). Thus, the enable output signal (NEXT) is at low voltage (Vgl), the node (D) is at high voltage (Vgh), and the fifth transistor (T5) is turned on. Accordingly, the output end (out) of the first stage of third switch (SW3) is at middle voltage (Vg0).

During the third period (TP3), the reset signal (RESET) is at low voltage (Vgl), and the start input signal (SP) is at low voltage (Vgl). Besides, the first clock input signal (CLKm) is at low voltage (Vgl), and the second clock input signal (XCLKm) is at high voltage (Vgh). Thus, the second transistor (T2) is turned off, the first transistor (T1) is turned on, and the node (A) is the first clock input signal (CLKm), so that the node (A) is at low voltage (Vgl), the node (B) is at high voltage (Vgh), and the node (C) is at low voltage (Vgl). Thus, the fourth transistor (T4) is turned off, the first switch (SW1) and the second switch (SW2) are turned on, and the enable output signal (NEXT) is the second clock input signal (XCLKm). Further, the enable output signal (NEXT) is at high voltage (Vgh), the node (D) is at low voltage (Vgl), the fifth transistor (T5) is turned off, and the third switch (SW3) is turned on. Accordingly, the output end (out) of the first stage of third switch (SW3) is the third clock signal (CLK3), and the output end (out) of the first stage of third switch (SW3) can output the third clock signal (CLK3) with a three-level voltage.

During the third period (TP3), the enable output signal (NEXT) of the first stage of shift register circuit 210 is at high voltage (Vgh). For the second stage of shift register circuit 210, the situation is similar to the second period (TP2) for the first stage of shift register circuit 210. Thus, for the second stage of shift register circuit 210, during the next period (TP4), the output end (out) of the second stage of third switch (SW3) begins to output the third clock signal (CLK3) with a three-level voltage.

During the fourth period (TP4), the reset signal (RESET) is at low voltage (Vgl) and the start input signal (SP) is at low voltage (Vgl). Besides, the first clock input signal (CLKm) is at high voltage (Vgh), the second clock input signal (XCLKm) is at low voltage (Vgl). The second transistor (T2) is turned off, the first transistor (T1) is turned on, and the node (A) is the first clock input signal (CLKm), so that the node (A) is at high voltage (Vgh), the node (B) is at low voltage (Vgl), and the node (C) is at high voltage (Vgh). Thus, the first switch (SW1) and the second switch (SW2) are turned off, and the fourth transistor (T4) is turned on. The enable output signal (NEXT) is at low voltage (Vgl), the node (D) is at high voltage (Vgh), the fifth transistor (T5) is turned on, and the third switch (SW3) is turned off, Accordingly, the output end (out) of the first stage of third switch (SW3) is at middle voltage (Vg0).

Since the enable output signal (NEXT) of the first stage of shift register circuit 210 is at high voltage (Vgh) during the third period (TP3), the output end (out) of the second stage of first switch (SW1) outputs the third clock signal (CLK3) with a three-level voltage during the fourth period (TP4).

Figure 5:
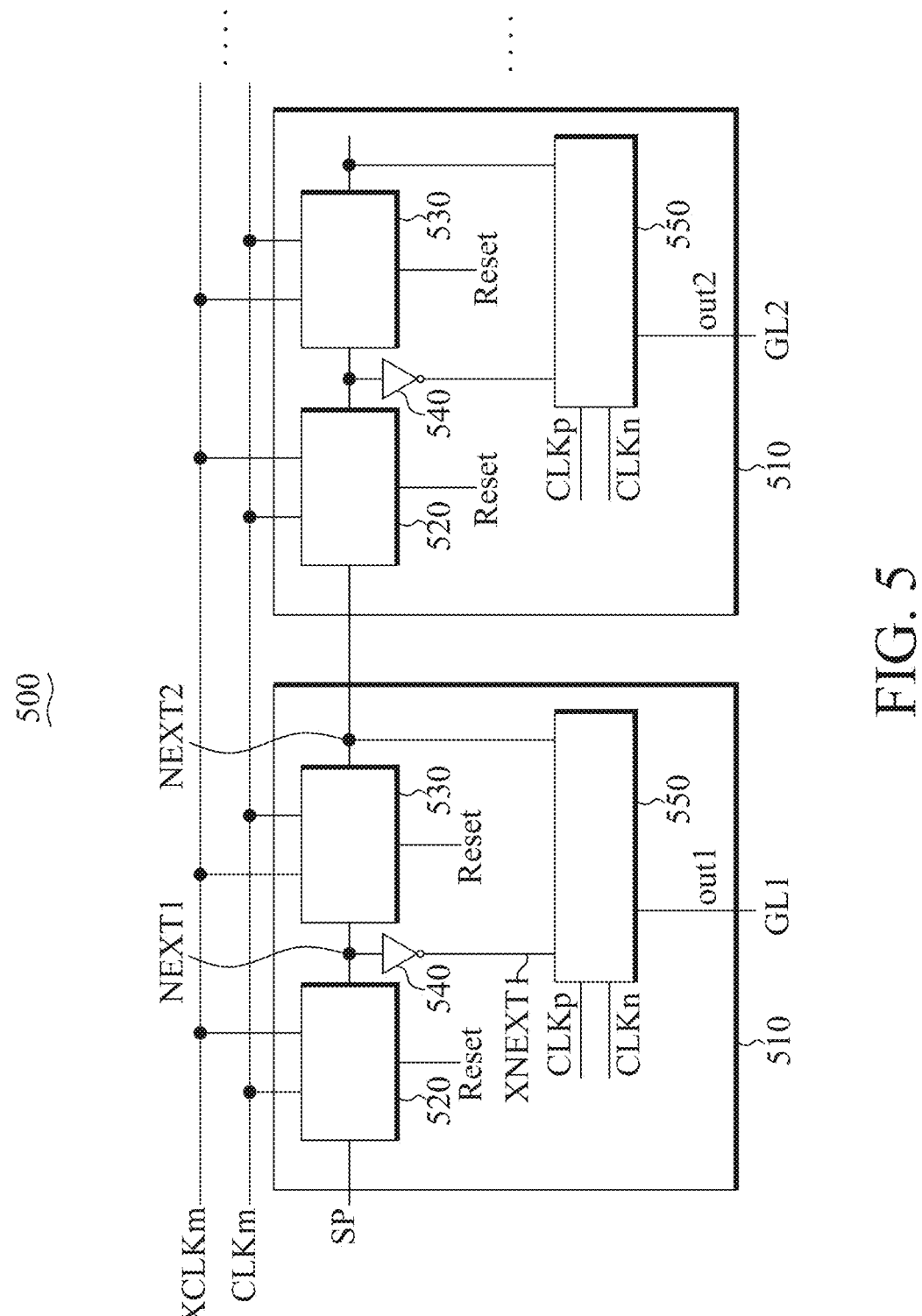
FIG. 5 is another block diagram of a gate driving circuit according to the present disclosure.

FIG. 5 is another block diagram of a gate driving circuit 500 with multi-level output voltage according to the present disclosure. As shown in FIG. 5, the gate driving circuit 500 includes multiple stages of shift register circuits 510, and each stage of shift register circuit 510 has the same circuit structure.

Each stage of shift register circuit 510 includes a first shift unit 520, a second shift unit 530, an inverting unit 540 and a switch unit 550. The first stage of shift register circuit 510 is connected to a first gate line GL1, the second stage of shift register circuit 510 is connected to a second gate line GL2, and so on.

The first shift unit 520 has a start input, a first clock input and a second clock input for receiving a start input signal (SP), a first clock input signal (CLKm) and a second clock input signal (XCLKm), respectively, so as to generate a first enable output signal (NEXT1).

The second shift unit 530 has a start input, a first clock input and a second clock input for receiving the first enable output signal (NEXT1), the second clock input signal (XCLKm) and the first clock input signal (CLKm), respectively, so as to generate a second enable output signal (NEXT2).

The inverting unit 540 is connected to the first shift unit 520 for receiving the first enable output signal (NEXT1), so as to generate an inverted first enable output signal (XNEXT1).

The switch unit 550 is connected to the inverting unit 540 and the second shift unit 530 for receiving a fourth clock signal (CLKp) with a two-level voltage and a fifth clock signal (CLKn) based on the inverted first enable output signal (XNEXT1) and the second enable output signal (NEXT2), thereby outputting a sixth clock signal, which is composed of the fourth clock signal (CLKp) and the fifth clock signal (CLKn), from an output end (out1) to the first gate line GL1, wherein the sixth clock signal has a three-level voltage. The second enable output signal (NEXT2) is a start input signal (SP) of the next stage of shift unit. It is noted that the sixth clock signal can have a multi-level voltage, but not limited to a three-level voltage. Similarly, the fourth clock signal (CLKp) and fifth clock signal (CLKn) each can have a multi-level voltage, but not limited to a two-level voltage.

The first shift unit 520 and the second shift unit 530 have the same circuit, wherein the first clock input of the first shift unit 520 is connected to the first clock input signal (CLKm), and the second clock input is connected to a second clock input signal (XCLKm). The first clock input of the second shift unit 530 is connected to the second clock input signal (XCLKm), the second clock input is connected to the first clock input signal (CLKm), and so on.

Each of the first shift unit 520 and the second shift unit 530 has a first switch (SW1), a second switch (SW2), a first transistor (T1), a second transistor (T2), a third transistor (T3), a fourth transistor (T4), a NOR gate and a first inverter (INV1). The first shift unit 520 and the second shift unit 530 have the same circuit of the shift unit 220 shown in FIG. 3, and thus a detailed description therefor is deemed unnecessary.

Figure 6:
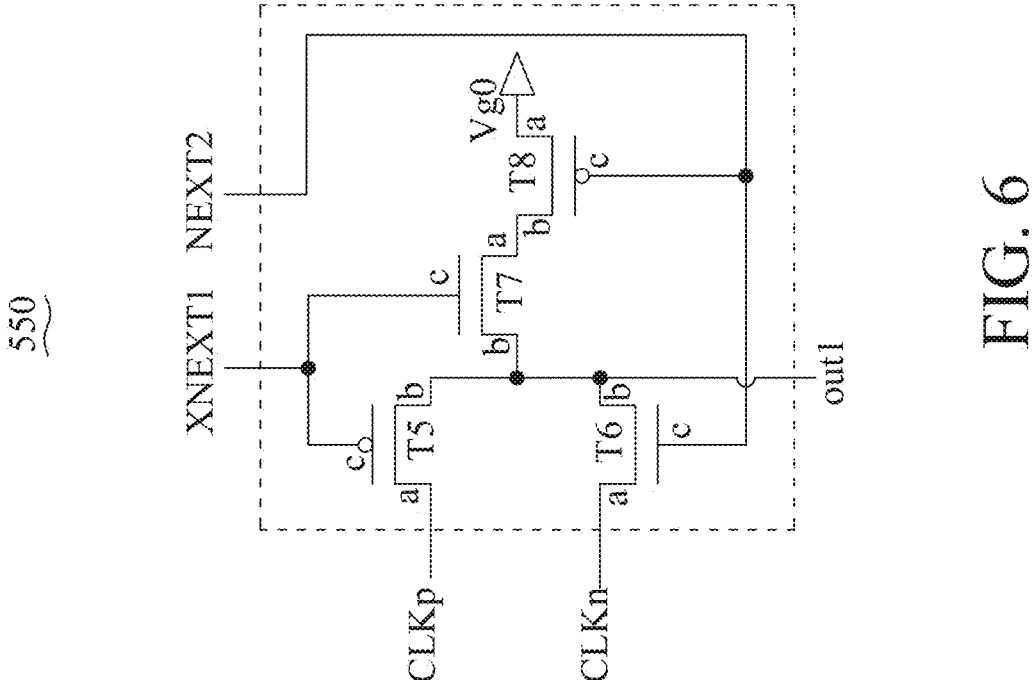
FIG. 6 is the circuit diagram of the switch unit according to the present disclosure.

FIG. 6 is the circuit diagram of the switch unit 550 according to the present disclosure. As shown in FIG. 6, the switch unit includes a fifth transistor (T5), a sixth transistor (T6), a seventh transistor (T7) and an eighth transistor (T8). The fifth transistor (T5) has a first end (a) connected to the fourth clock signal (CLKp), a second end (b) connected to an output (out1), and a third end (c) connected to the inverted first enable output signal (XNEXT1). The sixth transistor (T6) has a first end connected to the fifth clock signal (CLKn), a second end (b) connected to the second end (b) of the fifth transistor (T5), and a third end (c) connected to the second enable output signal (NEXT2). The seventh transistor (T7) has a first end (a) connected to a second end (b) of the eighth transistor (T8), a second end (b) connected to the second end (b) of the fifth transistor (T5), and a third end (c) connected to the inverted first enable output signal (XNEXT1). The eighth transistor (T8) has a first end (a) connected to a middle voltage (Vg0), and a third end (c) connected to the second enable output signal (NEXT2).

Figure 7:
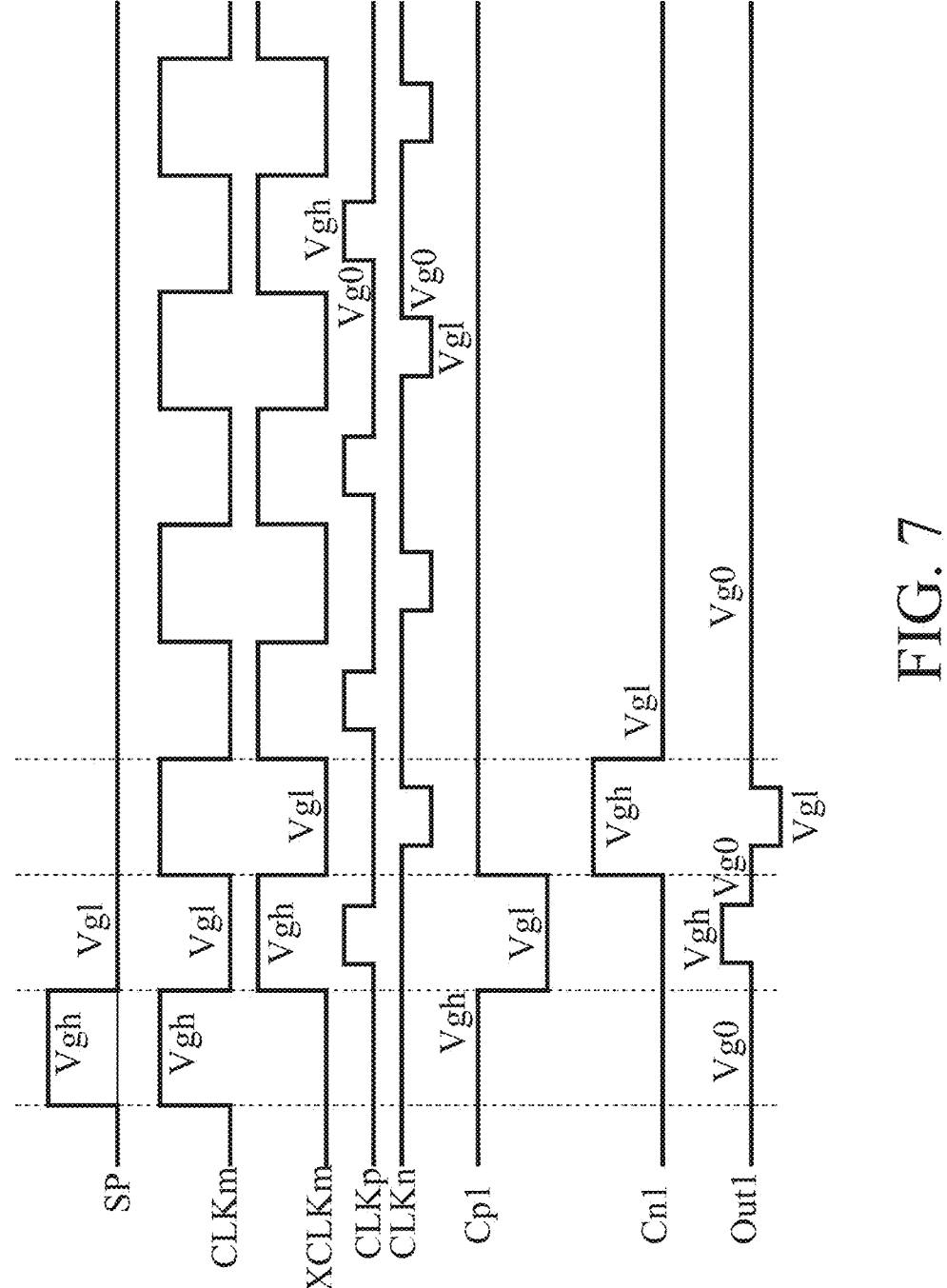
FIG. 7 is the timing diagram of the shift register circuit according to the present disclosure.

FIG. 7 is the timing diagram of the shift register circuit 510 according to the present disclosure. The operation thereof is similar to FIG. 4, and thus a detailed description therefor is deemed unnecessary. In FIG. 7, the fourth clock signal (CLKp) has voltage levels of middle voltage (Vg0) and high voltage (Vgh), and the fifth clock signal (CLKn) has voltage levels of middle voltage (Vg0) and low voltage (Vgl). In one embodiment, the high voltage (Vgh) can be 5 volt (V), the middle voltage (Vg0) can be 0 volt (V), and the low voltage (Vgl) can be −5 volt (V).

Figure 8:
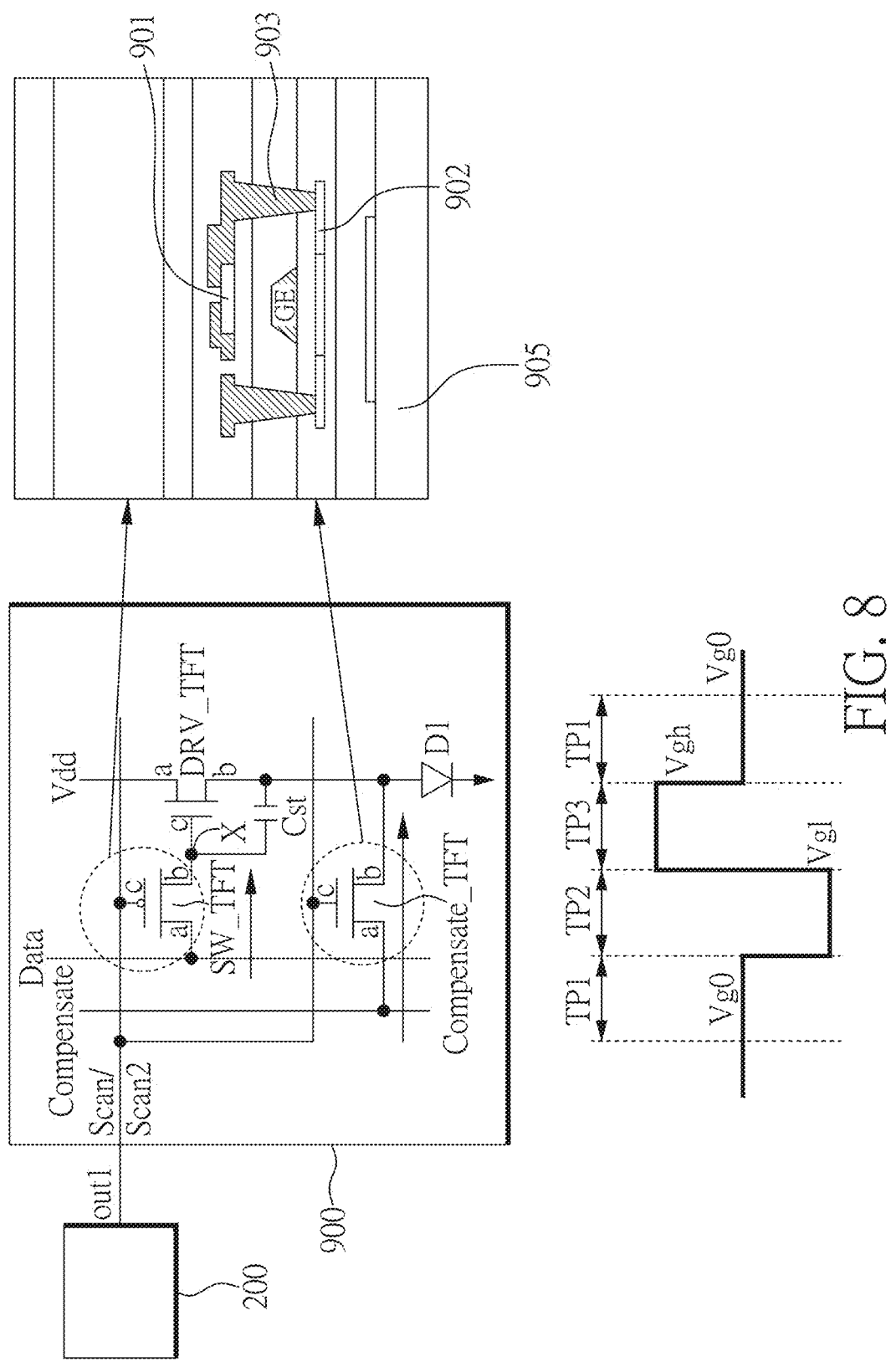
FIG. 8 is the application diagram of the gate driving circuit according to the present disclosure.

FIG. 8 is the application diagram of the gate driving circuit 200 according to the present disclosure. There is a driving circuit 900 applied in an active matrix OLED with hybrid transistors. As shown in FIG. 8, the driving circuit 900 includes a driving (ninth) transistor (DRV_TFT), a switching (tenth) transistor (SW_TFT), a compensating (eleventh) transistor (Compensate_TFT) and a storage capacitor (Cst), wherein the switching transistor (SW_TFT) is a P-type low temperature polysilicon (LTPS) transistor, and the compensating transistor (Compensate_TFT) is an N-type Indium Gallium Zinc Oxide (IGZO) transistor. It should be noted that the active matrix OLED is used for illustrative purpose. The present disclosure is also applicable to other types of display, such as a liquid crystal display, a quantum dot display, or a micro-LED display.

The driving transistor (DRV_TFT) has a first end (a) connected to a high voltage (Vdd), a second end (b) connected to an end of the storage capacitor (Cst), a second end (b) of the compensating transistor (Compensate_TFT) and an anode of the OLED (D1), and a third end (c) connected to the other end of the storage capacitor (Cst) and a second end (b) of the switching transistor (SW_TFT). The switching transistor (SW_TFT) has a first end (a) connected to a data line (Data), and a third end (c) connected to a scan line (Scan/Scan2), and the scan line (Scan/Scan2) is connected to an output signal (out1) of the gate driving circuit 200. The compensating transistor (Compensate_TFT) has a third end (c) connected to the scan line (Scan/Scan2), and a first end (a) connected to a compensating signal line (compensate).

The lower part of FIG. 8 is the operation diagram of the driving circuit 900. As shown in FIG. 8, during the first period (TP1), the output signal (out1) of the gate driving circuit 200 outputs a middle voltage (Vg0), and the switching transistor (SW_TFT) and the compensating transistor (Compensate_TFT) are turned off. During the second period (TP2), the output signal (out1) of the gate driving circuit 200 outputs a low voltage (Vgl), the switching transistor (SW_TFT) is turned on, and the compensating transistor (Compensate_TFT) is turned off. The voltage on the data line (Data) is a data voltage. Thus, the data line (Data) charges the storage capacitor (Cst) through the switching transistor (SW_TFT). The voltage of the node X is charged to the data voltage, the driving transistor (DRV_TFT) is turned on, and current flows from high voltage (Vdd) into the OLED (D1) through the driving transistor (DRV_TFT), so as to cause the emission of the OLED (D1).

During the third period (TP3), the output signal (out1) of the gate driving circuit 200 outputs a high voltage (Vgh), the switching transistor (SW_TFT) is turned off, and the compensating transistor (Compensate_TFT) is turned on. The current on the compensating signal line (compensate) flows into the OLED (D1) through the compensating transistor (Compensate_TFT), so as to conduct current compensation to the OLED (D1). In one embodiment, this is done by turning on the compensating transistor (Compensate_TFT) when powering on a display. By this, an external sensing device (not shown) detects the current flowing through the OLED (D1), determines the amount of the compensation current, and calculates the corresponding voltage Vgs. During the third period (TP3), voltage Vgs is applied to the first end (a) and the third end (c) of the compensating transistor (Compensate_TFT) through the compensating signal line (compensate) and the scan line (Scan/Scan2), so as to compensate the current of OLED (D1).

As shown in FIG. 8, the compensating transistor (Compensate_TFT) disposed on a substrate 905 is of a bottom gate structure provided with a first semiconductor layer 901, and the switching transistor (SW_TFT) disposed on the substrate 905 is of a top gate structure provided with a second semiconductor layer 902 disposed under the first semiconductor layer 901, wherein a conductor 903 directly connects the first semiconductor layer 901 and the second semiconductor layer 902. The compensating transistor (Compensate_TFT) and switching transistor (SW_TFT) connect to a gate. In other words, the compensating transistor and the switching transistor receive a signal from the same gate. As shown in FIG. 8, the switching transistor (SW_TFT) and the compensating transistor (Compensate_TFT) share a gate (GE). Thus, in the circuit layout, the switching transistor (SW_TFT) and compensating transistor (Compensate_TFT) are of a stack-up structure.

In other embodiments, the switching transistor (SW_TFT) can be an N-type IGZO transistor, the compensating transistor (Compensate_TFT) can be a P-type LTPS transistor.

In view of the forgoing, it is known that the gate driving circuit provides a multi-level output voltage, such as a three-level output voltage, which is applicable in a driving circuit with CMOS devices. In one embodiment of the driving circuit of the present disclosure, there is provided a stack-up structure of an N-type IGZO transistor and P-type LTPS transistor connected with a gate. In other words, the N-type IGZO transistor and the P-type LTPS transistor receive a signal from the same gate.

Although the present invention has been explained in relation to its preferred embodiment, it is to be understood that many other possible modifications and variations can be made without departing from the spirit and scope of the invention as hereinafter claimed. For example, the features in different embodiments of the present disclosure can be combined to form another embodiment.

What is claimed is:

1. An electronic device, comprising:
   a substrate;
   an oxide semiconductor layer disposed on the substrate;
   a silicon semiconductor layer disposed on the substrate;
   an electronic unit disposed on the substrate and electrically connected to the silicon semiconductor layer; and
   a conductor electrically connected to the oxide semiconductor layer and the silicon semiconductor layer,
   wherein, along a normal direction of the substrate, a first distance between the oxide semiconductor layer and the substrate is greater than a second distance between the silicon semiconductor layer and the substrate.

2. The electronic device as claimed in claim 1, wherein the electronic unit is an OLED.

3. The electronic device as claimed in claim 1, wherein the electronic unit is a micro-LED.

4. The electronic device as claimed in claim 1, wherein the conductor is directly connected to the oxide semiconductor layer.

5. The electronic device as claimed in claim 1, wherein the conductor is directly connected to the silicon semiconductor layer.

6. The electronic device as claimed in claim 1, wherein the conductor is directly connected to the oxide semiconductor layer and the silicon semiconductor layer.

7. The electronic device as claimed in claim 1, further comprising a gate electrode disposed on the silicon semiconductor layer.

8. The electronic device as claimed in claim 1, further comprising a gate electrode disposed under the oxide semiconductor layer.

9. The electronic device as claimed in claim 1, further comprising a first gate electrode disposed on the silicon semiconductor layer and a second gate electrode disposed under the oxide semiconductor layer, wherein the first gate electrode and the second gate electrode are located in a same layer.

10. The electronic device as claimed in claim 1, further comprising a gate driving circuit outputting a signal and a driving circuit receiving the signal, and the driving circuit comprises the silicon semiconductor layer and the oxide semiconductor layer.

11. The electronic device as claimed in claim 10, further comprising a gate electrode disposed on the silicon semiconductor layer.

12. The electronic device as claimed in claim 11, wherein the gate electrode receives the signal.

13. The electronic device as claimed in claim 1, wherein in a top view of the electronic device, a portion of the silicon semiconductor layer is overlapped with the oxide semiconductor layer.

14. The electronic device as claimed in claim 1, wherein in a top view of the electronic device, the silicon semiconductor layer is overlapped with the substrate.

15. The electronic device as claimed in claim 1, further comprising a gate electrode disposed on the silicon semiconductor layer, wherein the gate electrode and the silicon semiconductor layer is configured to be a transistor.

16. The electronic device as claimed in claim 1, further comprising a gate electrode disposed under the oxide semiconductor layer, wherein the gate electrode and the oxide semiconductor layer is configured to be a transistor.

17. The electronic device as claimed in claim 1, further comprising a first gate electrode disposed on the silicon semiconductor layer and a second gate electrode disposed under the oxide semiconductor layer, wherein the first gate electrode and the silicon semiconductor layer is configured to be a first transistor, the second gate electrode and the oxide semiconductor layer is configured to be a second transistor, and the first gate electrode and the second gate electrode are located in a same layer.

18. The electronic device as claimed in claim 17, further comprising a gate driving circuit outputting a signal and a driving circuit receiving the signal, and the driving circuit comprises the first transistor and the second transistor.

19. The electronic device as claimed in claim 18, wherein the first transistor receives the signal.

20. The electronic device as claimed in claim 18, wherein the second transistor receives the signal, wherein during a first period, the signal has a middle voltage, during a second period after the first period, the signal has a low voltage, and during a third period after the second period, the signal has a high voltage.

* * * * *